(12) United States Patent
Chen et al.

(10) Patent No.: US 7,161,226 B2
(45) Date of Patent: Jan. 9, 2007

(54) MULTI-LAYERED COMPLEMENTARY WIRE STRUCTURE AND MANUFACTURING METHOD THEREOF

(75) Inventors: Yu-Cheng Chen, Taipei (TW); Chi-Lin Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 93 days.

(21) Appl. No.: 11/131,084

(22) Filed: May 17, 2005

(65) Prior Publication Data
US 2005/0253249 A1    Nov. 17, 2005

Related U.S. Application Data

(63) Continuation-in-part of application No. 10/687,759, filed on Oct. 20, 2003.

(51) Int. Cl.
*H01L 29/00* (2006.01)
(52) U.S. Cl. .................. 257/522; 257/758; 438/411; 438/619
(58) Field of Classification Search ............. 257/522, 257/276, 758, 776, E23.013, E23.17; 438/619, 438/622, 319, 411
See application file for complete search history.

(56) References Cited

U.S. PATENT DOCUMENTS

| | | | |
|---|---|---|---|
| 4,899,439 A * | 2/1990 | Potter et al. .................. 29/846 |
| 4,938,567 A | 7/1990 | Chartier | |
| 5,095,352 A * | 3/1992 | Noda et al. .................. 257/202 |
| 5,309,015 A * | 5/1994 | Kuwata et al. ............. 257/659 |
| 5,789,807 A * | 8/1998 | Correale, Jr. ................ 257/691 |
| 6,060,383 A * | 5/2000 | Nogami et al. ............. 438/622 |
| 6,088,283 A * | 7/2000 | Hayashi .................. 365/230.03 |
| 6,188,095 B1 * | 2/2001 | Hieke .......................... 257/596 |
| 6,717,268 B1 * | 4/2004 | Hau-Riege .................. 257/758 |
| 6,919,637 B1 * | 7/2005 | He et al. ..................... 257/758 |
| 7,071,565 B1 * | 7/2006 | Li et al. ...................... 257/775 |

* cited by examiner

*Primary Examiner*—S. V. Clark
(74) *Attorney, Agent, or Firm*—Akin Gump Strauss Hauer & Feld, LLP

(57) ABSTRACT

A multi-layered wire structure includes a substrate, a plurality of first conductive lines formed in a first layer over the substrate extending in parallel to each other in a first direction, a plurality of second conductive lines formed in a second layer over the first layer extending in parallel to each other in a second direction orthogonal to the first direction, a plurality of sets of third conductive lines formed in the second layer extending in the first direction, each set of third conductive lines corresponding to one of the first conductive lines, and a plurality of sets of conductive paths formed between the first layer and the second layer, each set of conductive paths corresponding to one of the first conductive lines and one set of third conductive lines and electrically connecting the corresponding first conductive line to the corresponding set of third conductive lines.

20 Claims, 15 Drawing Sheets

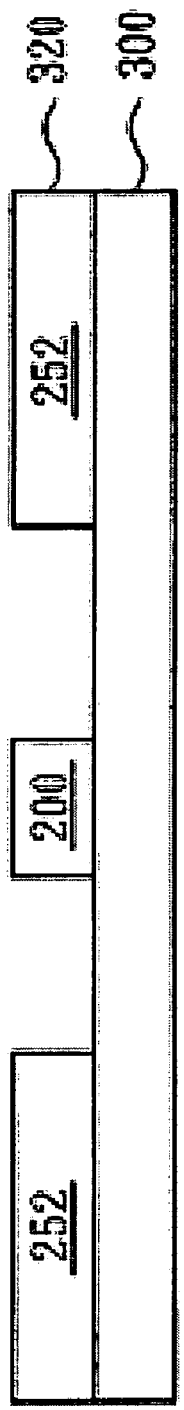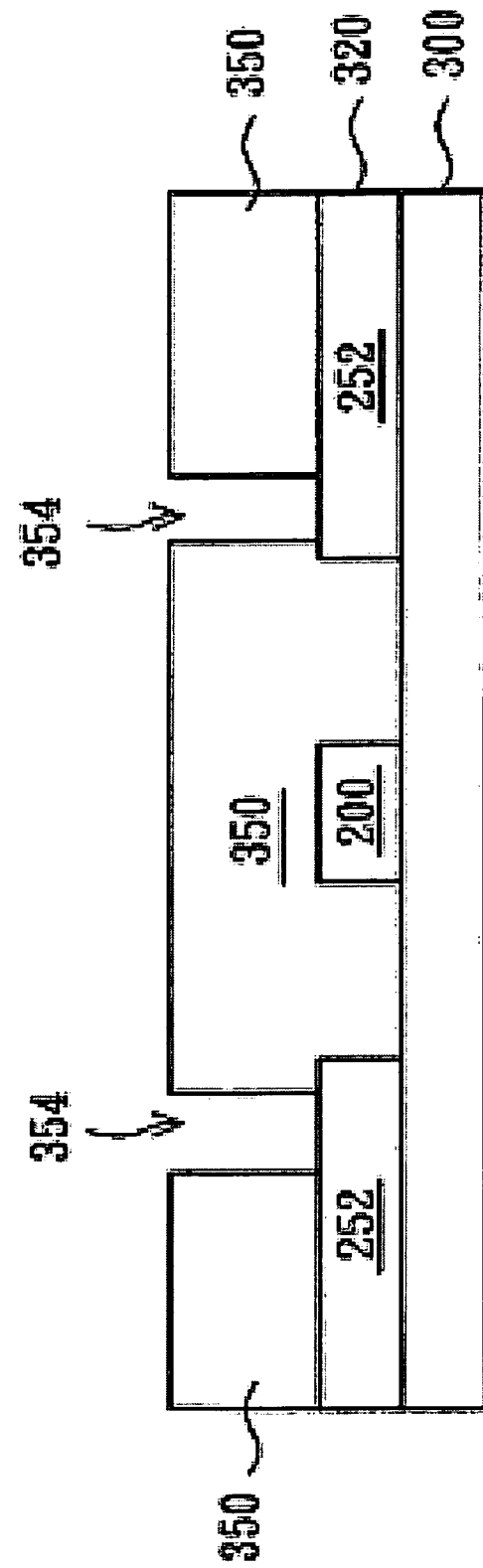

MULTI-LAYERED COMPLEMENTARY WIRE STRUCTURE AND MANUFACTURING METHOD THEREOF

CROSS-REFERENCE TO RELATED APPLICATIONS

This application is a continuation-in-part of U.S. patent application Ser. No. 10/687,759, filed Oct. 20, 2003, which is herein incorporated by reference in its entirety.

BACKGROUND OF THE INVENTION

I. Field of the Invention

The present invention relates generally to a multi-layered complementary wire structure and a manufacturing method thereof, and more particularly, to a multi-layered complementary wire structure and a manufacturing method thereof that can substantially reduce the resistance of the wire.

II. Background Art

With rapid developments in multimedia techniques, advanced peripheral audio-visual equipments are increasingly demanded by users. A conventional display composed of a cathode ray tube (CRT) or an image tube can no longer satisfy the current demands for compact, lightweight equipments. Recently, many flat panel display technologies, such as the liquid crystal display (LCD), plasma display panel (PDP) display and field emission display (FED), have been developed sequentially and have become the standards in display technology.

FIG. 1 illustrates a schematic diagram of a thin film transistor array plate of a conventional display. Referring to FIG. 1, a thin film transistor array plate 10 comprises a plurality of pixel units, i.e. pixels 18, arranged in a matrix. Each of the pixels 18 includes a thin film transistor 16, and the pixels 18 are separated by a plurality of gate lines 14 formed laterally in parallel to each other and a plurality of data lines 12 formed vertically in parallel to each other. The gate lines 14 and the data lines 12 are connected to the thin film transistors 16 of the pixels 18.

FIG. 2 illustrates a schematic diagram of a pixel of a conventional display. Referring to FIG. 2, each pixel 18 includes a thin film transistor 16. Each gate line 14 is connected to a gate 26 of the thin film transistor 16, and each data line 12 is connected to a source 20 and a drain 22 of the thin film transistor 16. An insulating layer (not shown) and an active layer 24 are located between the gate 26, the source 20 and the drain 22. Moreover, each pixel 18 further comprises a pixel electrode 28, which is connected to the drain 22. The thin film transistor 16 functions to serve as a switch device for the pixel electrode 28.

In general, each gate line 14 and each data line 12 are located in different metal layers. In the overlapping regions of the gate lines 14 and the data lines 12, the gate lines 14 are not connected to the data lines 12 and are insulated by insulating layers 30 peripherally, such as shown in FIG. 3. As displays become larger in size, gate lines and data lines become longer. As a result, the overall resistance of the gate lines and data lines increase, which may disadvantageously incur undesired resistance-capacitance delay (RC delay) and adversely affect the operating speed of the display devices.

BRIEF SUMMARY OF THE INVENTION

The present invention is directed to a structure and a method that obviate one or more problems resulting from the limitations and disadvantages of the prior art.

In accordance with an embodiment of the present invention, there is provided a multi-layered wire structure that comprises a substrate, a plurality of first conductive lines formed in a first layer over the substrate extending in parallel to each other in a first direction, a plurality of second conductive lines formed in a second layer over the first layer extending in parallel to each other in a second direction orthogonal to the first direction, a plurality of sets of third conductive lines formed in the second layer extending in the first direction, each set of third conductive lines corresponding to one of the first conductive lines, and a plurality of sets of conductive paths formed between the first layer and the second layer, each set of conductive paths corresponding to one of the first conductive lines and one set of third conductive lines and electrically connecting the corresponding first conductive line to the corresponding set of third conductive lines.

In one aspect, the third conductive lines in each set are separated apart from each other at a predetermined spacing.

Also in accordance with the present invention, there is provided a multi-layered wire structure that comprises a substrate, a plurality of first conductive lines formed in a first layer over the substrate extending in parallel to each other in a first direction, a plurality of second conductive lines formed in a second layer over the first layer extending in parallel to each other in a second direction orthogonal to the first direction, a plurality of sets of third conductive lines formed in the first layer extending in the second direction, each set of third conductive lines corresponding to one of the second conductive lines, and a plurality of sets of conductive paths formed between the first layer and the second layer, each set of conductive paths corresponding to one of the second conductive lines and one set of third conductive lines and electrically connecting the corresponding second conductive line to the corresponding set of third conductive lines.

Further in accordance with the present invention, there is provided a display device that comprises a substrate, a plurality of gate lines formed in a first layer over the substrate extending in parallel to each other in a first direction, a plurality of data lines formed in a second layer over the first layer extending in parallel to each other in a second direction orthogonal to the first direction, an array of pixel units formed over the substrate, each of the pixel units being disposed near an intersection of one of the gate lines and one of the data lines, a plurality of sets of conductive lines formed in the second layer extending in the first direction, each set of conductive lines corresponding to one of the gate lines, and a plurality of sets of conductive paths formed between the first layer and the second layer, each set of conductive paths corresponding to one of the gate lines and one set of conductive lines and electrically connecting the corresponding gate line to the corresponding set of conductive lines.

Still in accordance with the present invention, there is provided a display device that comprises a substrate, a plurality of gate lines formed in a first layer over the substrate extending in parallel to each other in a first direction, a plurality of data lines formed in a second layer over the first layer extending in parallel to each other in a second direction orthogonal to the first direction, a plurality of pixel units formed over the substrate, each of the pixel units being disposed near an intersection of one of the gate lines and one of the data lines, a plurality of sets of conductive lines formed in the first layer extending in the second direction, each set of conductive lines corresponding to one of the data lines, and a plurality of sets of conductive paths formed between the first layer and the second layer, each set of conductive paths corresponding to one of the data lines and one set of conductive lines and electrically connecting the corresponding data line to the corresponding set of conductive lines.

Yet still in accordance with the present invention, there is provided a method for manufacturing a multi-layered wire structure that comprises defining a substrate, forming a first conductive layer over the substrate, patterning the first conductive layer to form a plurality of first conductive lines in parallel to each other extending in a first direction and a plurality of sets of second conductive lines in parallel to each other extending in a second direction orthogonal to the first direction, each set of second conductive lines corresponding to one of the first conductive lines, forming an insulating layer on the first conductive layer, patterning the insulating layer to form openings into the insulating layer to expose a portion of each of the second conductive lines, forming a second conductive layer on the insulating layer to fill the openings, and patterning the second conductive layer to form a plurality of third conductive lines extending in the second direction, each of the third conductive lines corresponding to one set of second conductive lines.

Further still with the present invention, there is provided a method for manufacturing a multi-layered wire structure that comprises defining a substrate, forming a first conductive layer over the substrate, patterning the first conductive layer to form a plurality of first conductive lines in parallel to each other extending in a first direction, forming an insulating layer on the first conductive layer, patterning the insulating layer to form openings into the insulating layer to expose portions of each of the first conductive lines, forming a second conductive layer on the insulating layer to fill the openings, and patterning the second conductive layer to form a plurality of second conductive lines extending in a second direction orthogonal to the first direction and a plurality of sets of third conductive lines in parallel to each other extending in the first direction, each set of the third conductive lines corresponding to one of the first conductive lines.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the present invention and together with the description, serves to explain the principles of the invention.

BRIEF DESCRIPTION OF THE DRAWINGS

Reference will now be made in detail to the present embodiment of the invention, an example of which is illustrated in the accompanying drawings. Wherever possible, the same reference numbers are used throughout the drawings to refer to the same or like parts.

FIG. 7a to FIG. 8c are schematic flow diagrams showing the process for manufacturing a wire structure in accordance with a preferred embodiment of the present invention, in which FIG. 7a to FIG. 7c are cross-sectional diagrams taken along line I—I in FIG. 6, and FIG. 8a to FIG. 8c are cross-sectional diagrams taken along line II—II in FIG. 6;

DETAILED DESCRIPTION OF THE INVENTION

The present invention is related to a wire structure having a multi-layered complementary feature. The following is an illustration in accordance with a preferred embodiment of the present invention. In order to make the illustration of the present invention more explicit and complete, the following description and the drawings from FIG. 4 to FIG. 9 are provided.

Figure 1:
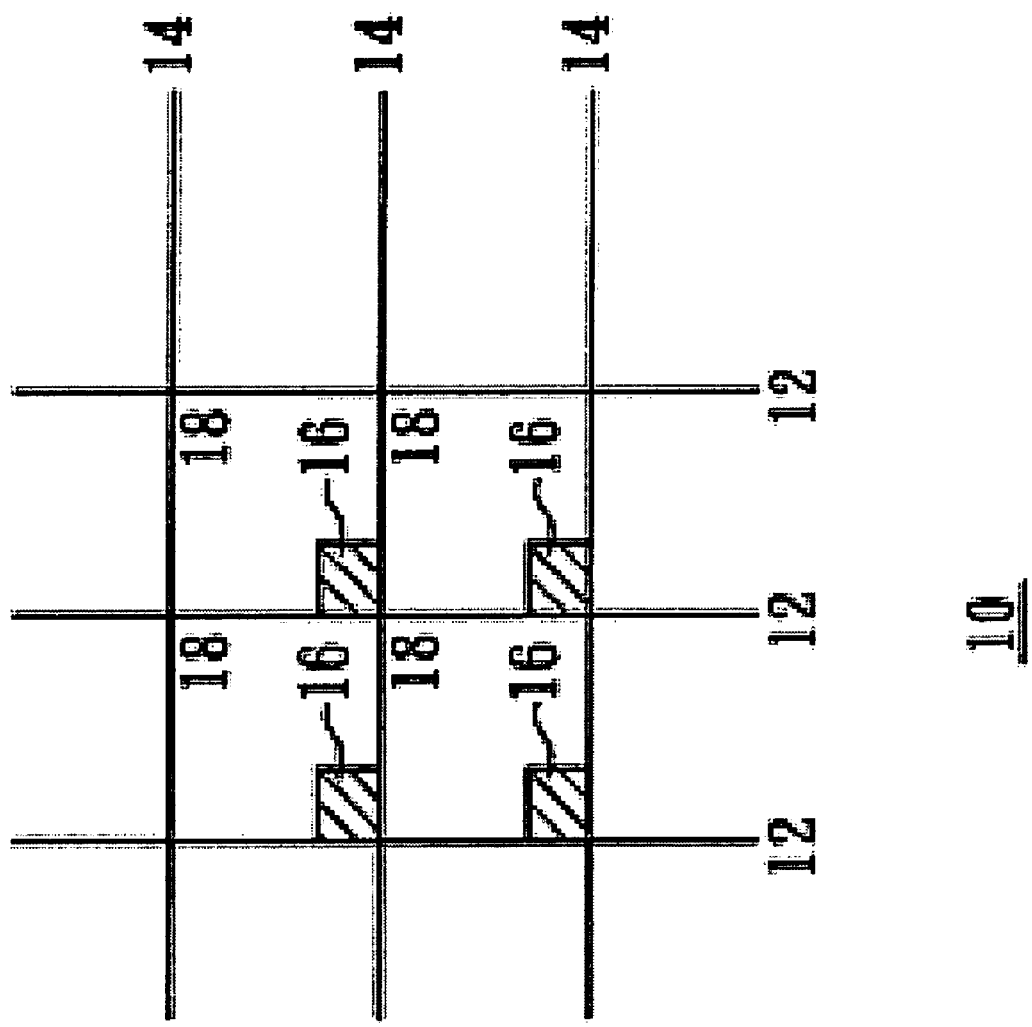
FIG. 1 is a schematic diagram of a thin film transistor array plate of a conventional display.
Figure 2:
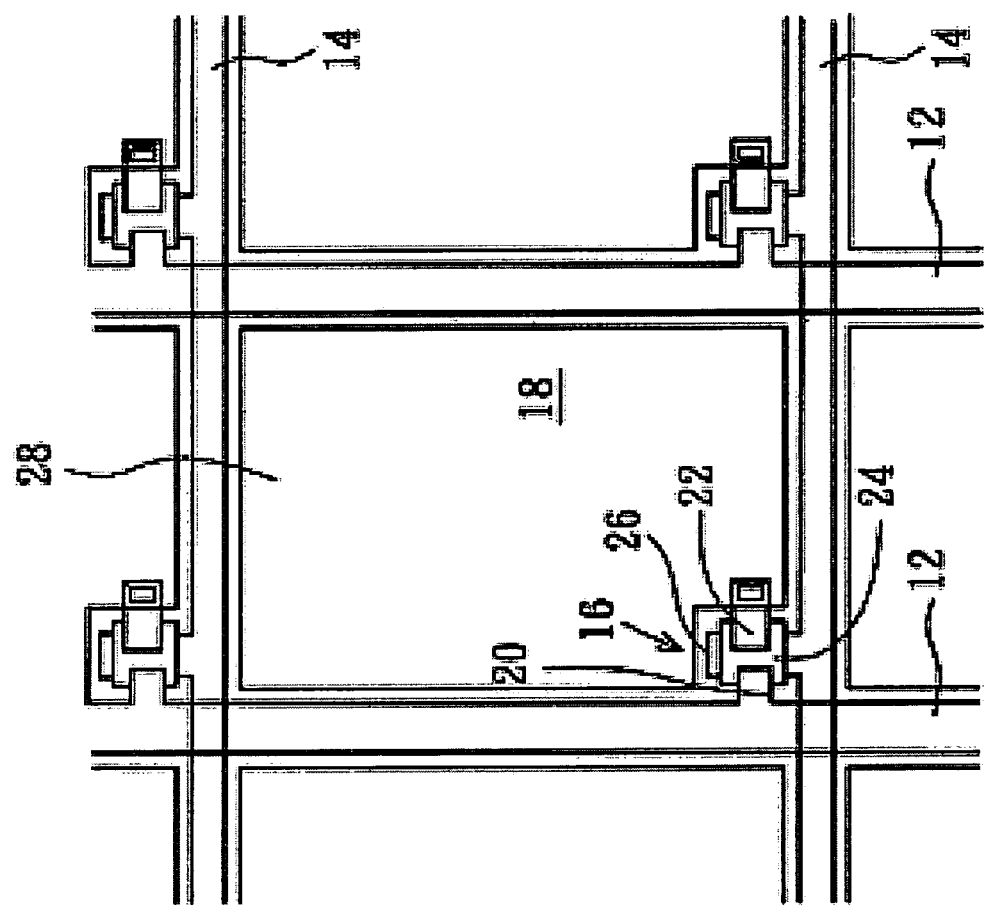
FIG. 2 is a schematic diagram of a pixel of a conventional display.
Figure 3:
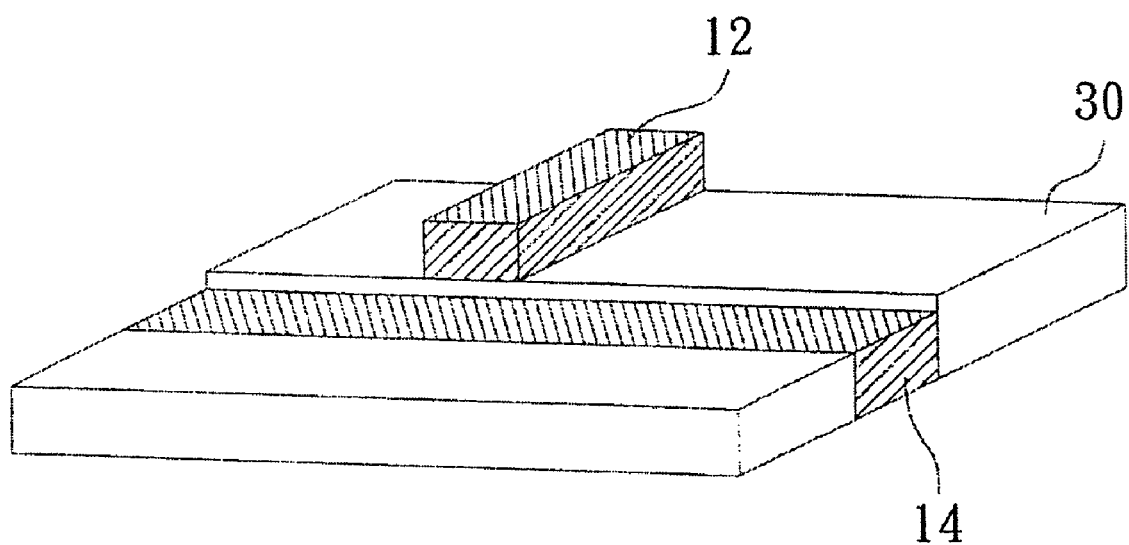
FIG. 3 is a schematic diagram of a conventional metal layer structure where a gate line and a data line are located in different layers.
Figure 4:
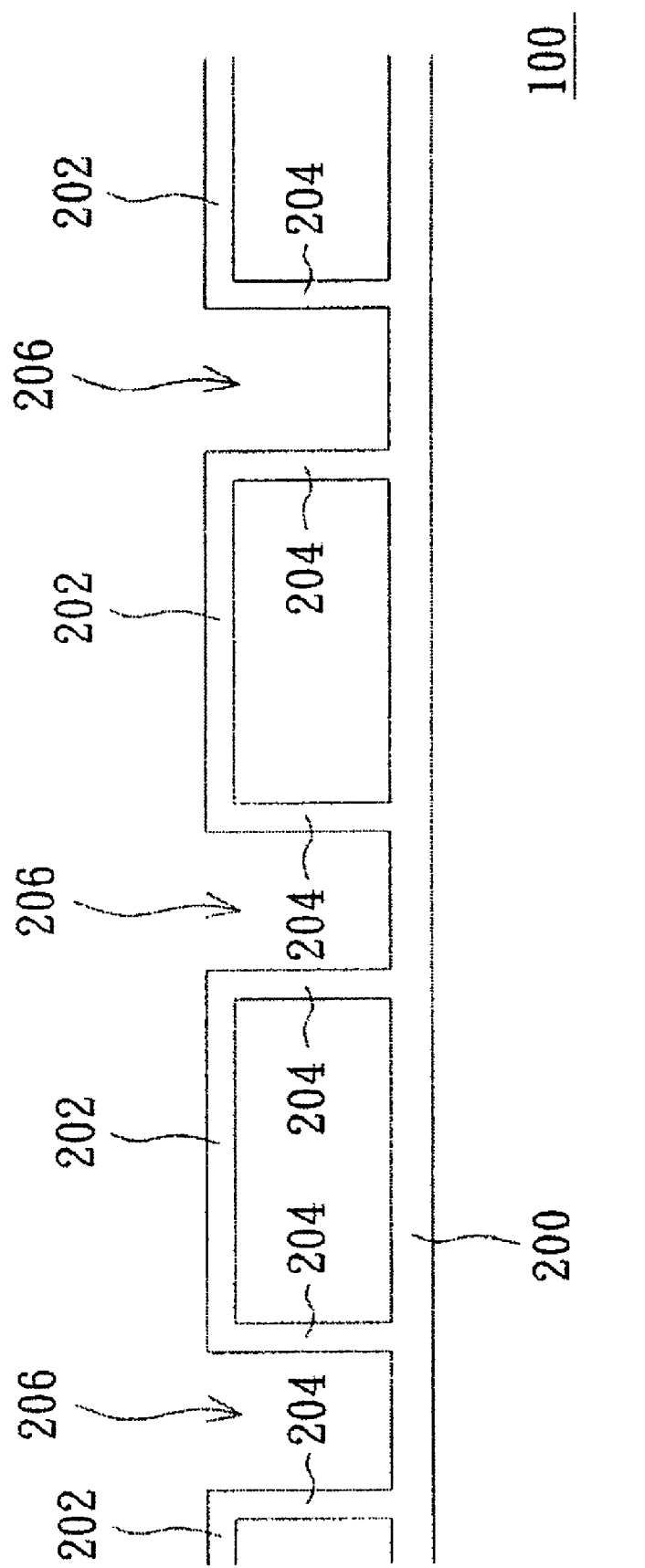
FIG. 4 illustrates a cross-sectional view of a wire structure of a gate line in accordance with a preferred embodiment of the present invention.

FIG. 4 illustrates a cross-sectional view of a wire structure of a gate line in accordance with a preferred embodiment of the present invention. Referring to FIG. 4, a wire structure 100 used as a gate line in a display of the present invention comprises a slender main line 200 and a plurality of branch lines 202 located in-line and separated. Because the main line 200 and the branch lines 202 are located in different layers, two ends of each of the branch lines 202 are connected to the main line 200 by plugs 204, thus forming a double-layered, tooth-like wire structure comprising a plurality of fillisters 206.

A formula for calculating resistance is:

$R=\rho*L/A,$ where R represents the resistance of a material, p represents the resistivity of the material, L represents the length of a wire and A represents the cross-sectional area of the wire.

When using aluminum (Al) and copper (Cu) to manufacture conventional long wire structures respectively, and assuming a total length of the wires equal to 10 and the cross-sectional area of the wires equal to 1, the obtained resistances of the wire structures are listed as follows in Table 1:

|  | Material of Wire | Resistance |
|---|---|---|
| Conventional Wire Structure | Al (ρ = 2.67) | 26.7 μΩ |
|  | Cu (ρ = 1.67) | 16.7 μΩ |

In addition, taking the structure shown in FIG. 4 as an example, when using aluminum and copper to manufacture double-layered, tooth-like wire structures of the present invention, assuming the main line 200 composed of one fillister 206, one branch line 202 and two plugs 204, the total length of the main line 200 equal to 10, the length of branch line 202 equal to b, the width of the fillister 206 equal to a (i.e. 10-b) and the cross-sectional areas of the main line 200 and the branch line 202 both equal to 1. When the ratio of the length of the branch line 202 to the width of the fillister 206 varies, the overall resistances-are-listed as follows in Table 2:

|  |  | Resistance | | |
|---|---|---|---|---|
|  | Material of Wire | b/a = 9 | b/a = 6 | b/a = 2 |
| Doubled Layered, Tooth-like Wire Structure | Al (ρ = 2.67) | 14.7 μΩ | 15.3 μΩ | 17.8 μΩ |
|  | Cu (ρ = 1.67) | 9.2 μΩ | 9.5 μΩ | 11.1 μΩ |

Accordingly, no matter what the ratio of the length of the branch line 202 to the width of the fillister 206 is, the resistance of the double-layered, tooth-like wire structure of the present invention is less than that of a conventional wire structure, so the present invention is not limited to the ratio of the length of the branch line 202 to the width of the fillister 206. In the double-layered, tooth-like wire structure of the present invention, when the proportion of the branch line 202 parallel to the main line 200 increases, i.e. the ratio b/a increases, the resistance of the overall wire decreases.

Figure 5:
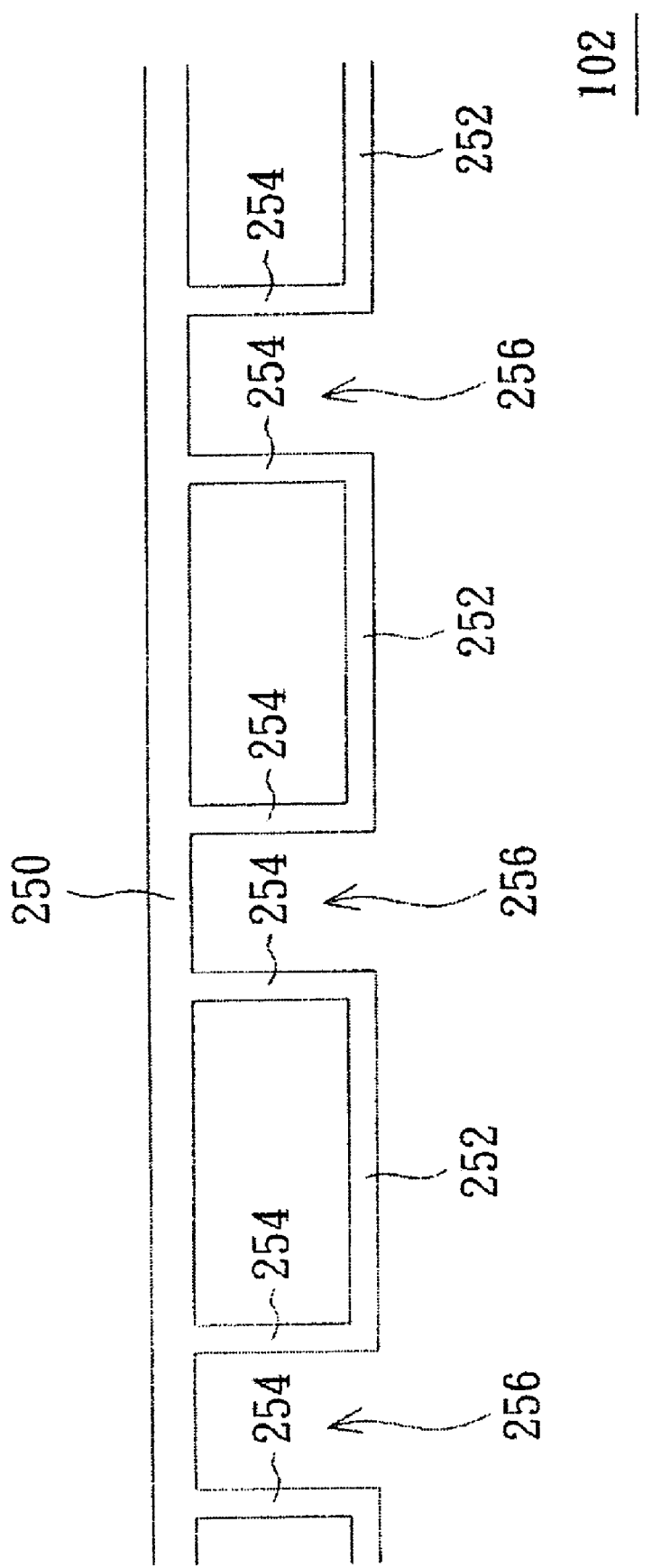
FIG. 5 illustrates a cross-sectional view of a wire structure of a data line matching the wire structure shown in FIG. 4.

When the wire structure of the gate line of the present invention is applied in a display, a wire structure used as a data line matching the gate line is illustrated in FIG. 5. Because the perpendicular-crossed connection between the gate line and the data line must be considered, the wire structure used as the data line is complementary to the wire structure used as the gate line. Referring to FIG. 5, a wire structure 102 comprises a long main line 250 and a plurality of branch lines 252 located in-line and separated. Two ends of each of the branch lines 252 are connected to the main line 250 by plugs 254, thus forming a double-layered, tooth-like wire structure comprising a plurality of fillisters 256. Comparing the structure in FIG. 5 with that in FIG. 4, it can be seen that the wire structure 100 in FIG. 4 and the wire structure 102 in FIG. 5 are symmetrical.

Figure 6:
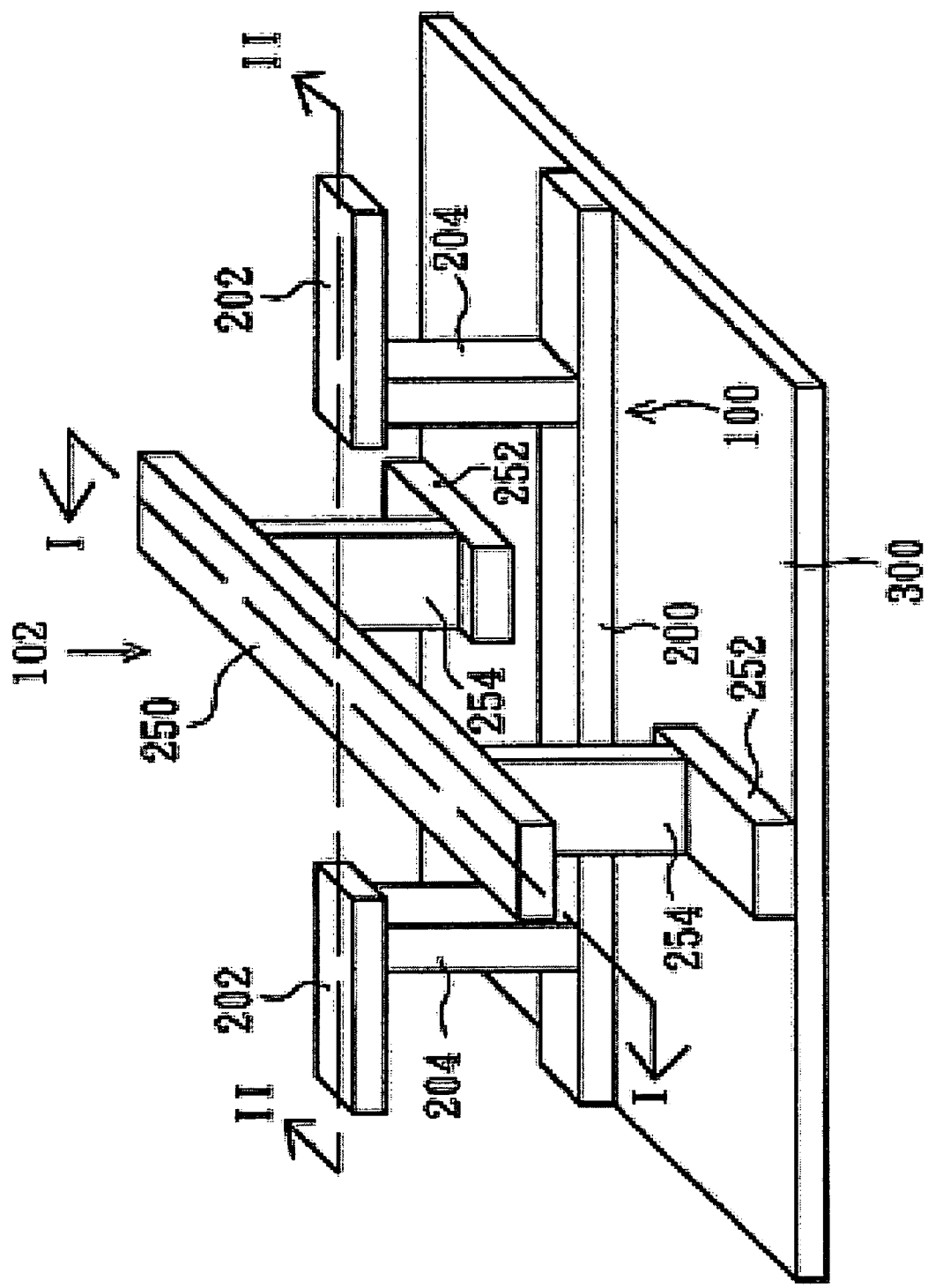
FIG. 6 is a schematic, 3-D diagram showing the wire structure of FIG. 4 crossed with the wire structure of FIG. 5.

FIG. 6 is a schematic, 3-D diagram showing the wire structure shown in FIG. 4 crossed with the wire structure shown in FIG. 5. Referring to FIG. 6, in a typical display, gate lines and data lines are mutually perpendicular to form a crossed structure, and thus constructing pixel units arranged in a matrix. In the present invention, the wire structure 100 used as the gate line and the wire structure 102 used as the data line are arranged by crossing so that the fillisters 206 in FIG. 4 and the fillisters 256 in FIG. 5 are opposite each other on a substrate 300. That is to say, the main line 200 of the wire structure 100 and the branch lines 252 are in the same layer, and the branch lines 252 are located on two sides of the main line 200, respectively. The main line 250 of the wire structure 102 and the branch lines 202 are all in another layer.

Referring to FIG. 7a to FIG. 8c, FIG. 7a to FIG. 8c are schematic flow diagrams showing the process for manufacturing a wire structure in accordance with a preferred embodiment of the present invention. With simultaneous reference to FIG. 6, FIG. 7a to FIG. 7c are cross-sectional diagrams taken along line I—I in FIG. 6, and FIG. 8a to FIG. 8c are cross-sectional diagrams taken along line II—II in FIG. 6.

Figure 7C:
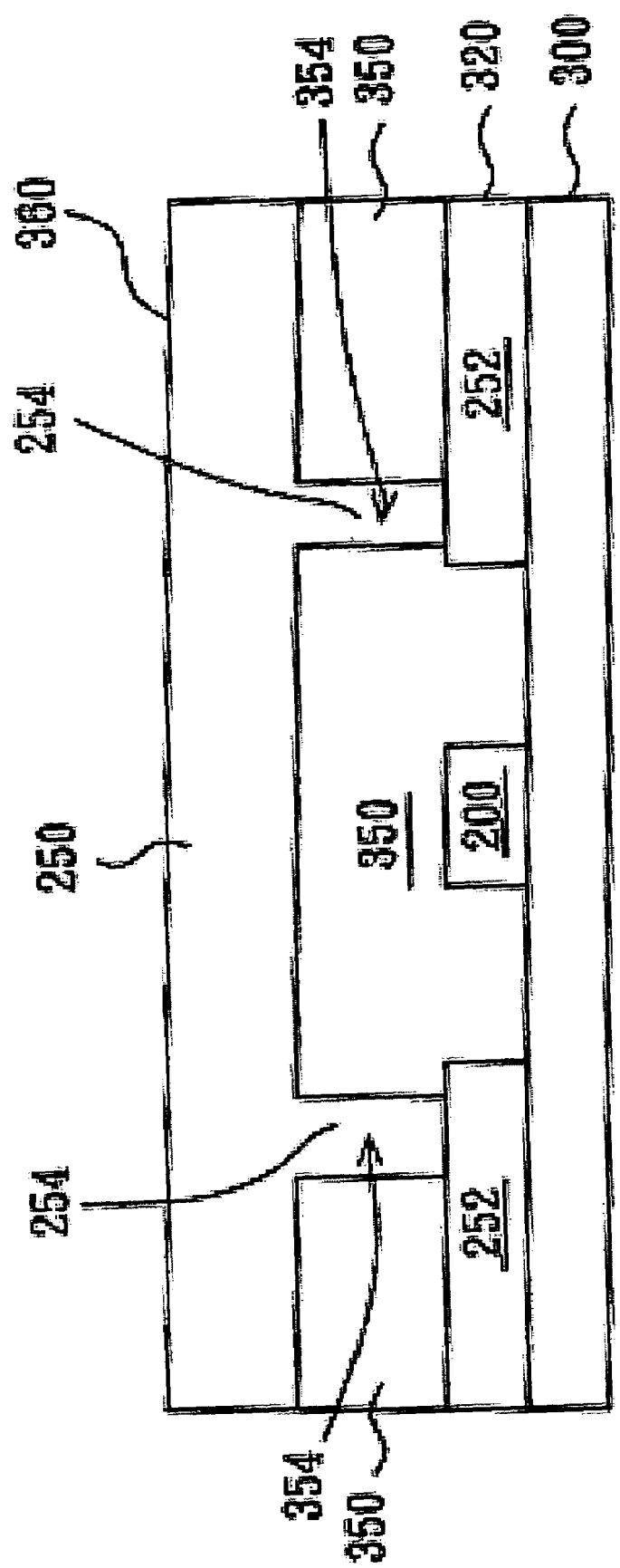
Figure 8A:
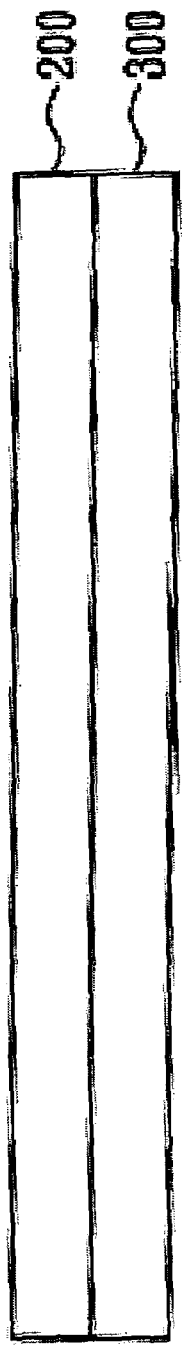

When forming a wire structure of the present invention, a material layer 320 is first formed on a substrate 300 by, for example, a deposition method. The conductive material layer 320 is defined by, for example, photolithography and etching to form main line 200 of the wire structure 100 and branch lines 252 of the wire structure 102, as illustrated in FIG. 7a and FIG. 8a.

Figure 8B:
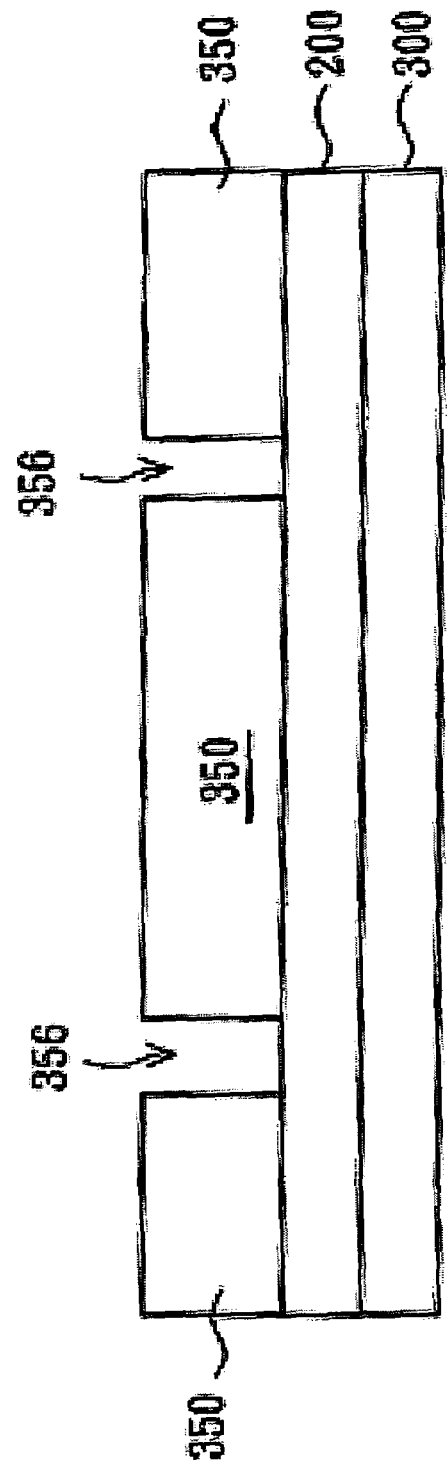

Then, an insulating layer 350 is formed to cover the conductive material layer 320 and the substrate 300 by, for example, a deposition method. Next, the insulating layer 350 is defined by, for example, photolithography and etching to form a plurality of contact holes 354 and a plurality of contact holes 356 in the insulating layer 350, as illustrated in FIG. 7b and FIG. 8b, respectively. Each of the contact holes 354 exposes a portion of the branch lines 252 of the wire structure 102, respectively, and the contact holes 356 expose a portion of the main line 200 of the wire structure 100.

Figure 8C:
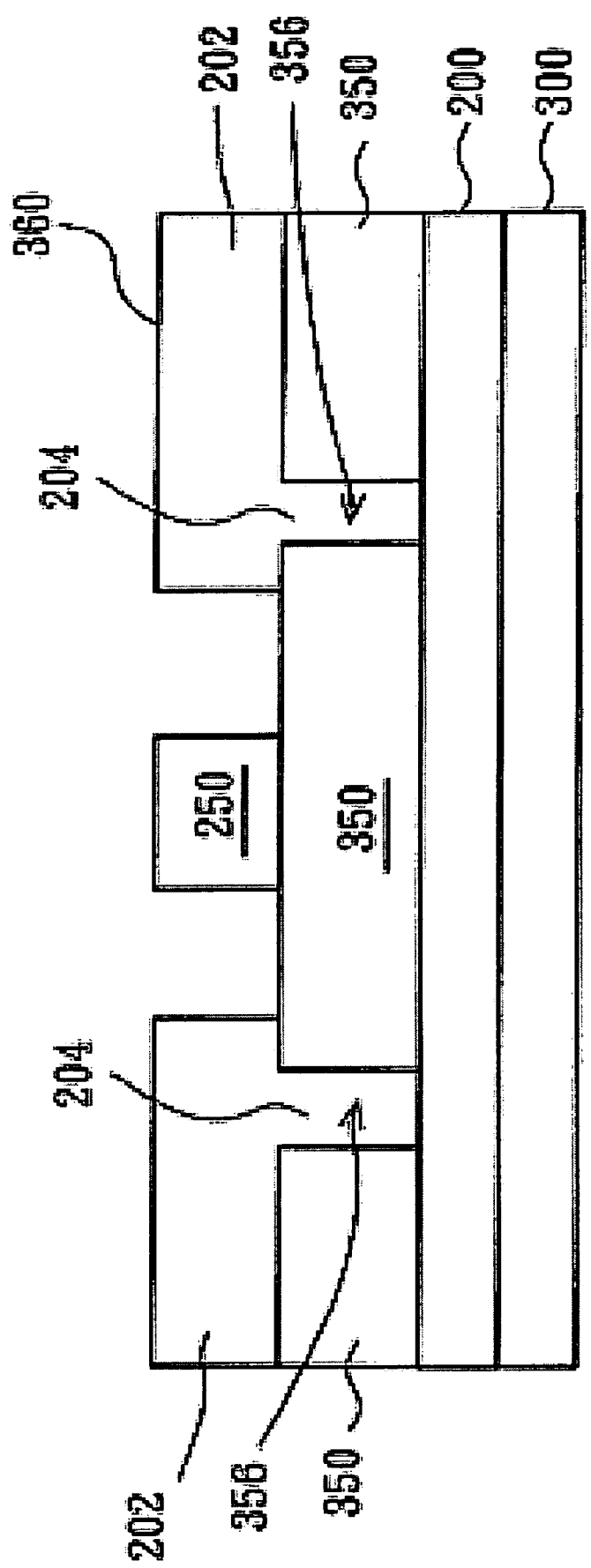

Subsequently, a conductive material layer 360 is formed to cover the insulating layer 350 and fill the contact holes 354 and the contact holes 356 by, for example, a deposition method. A plurality of plugs 254 and a plurality of plugs 204 are formed respectively with the conductive materials in the contact holes 354 and the contact holes 356. Next, the conductive material layer 360 is defined by, for example, photolithography and etching to form a main line 250 of the wire structure 102 and branch lines 202 of the wire structure 100, as illustrated in FIG. 7c and FIG. 8c.

Hence, a double-layered complementary wire structure such as the one illustrated in FIG. 6 is formed on the substrate 300. The plugs 204 and the plugs 254 all must align with the main line 200 of the wire structure 100 and the branch lines 252 of the wire structure 102, and are separated from one another. Further, in addition to aligning with the plugs 204, the branch lines 202 of the wire structure 100 also need to align, with—the main line 200 of the wire structure 100, and in addition to aligning with the plugs 254, the main line 250 of the wire structure 102 also must align with the branch lines 252 of the wire structure 102.

Figure 9:
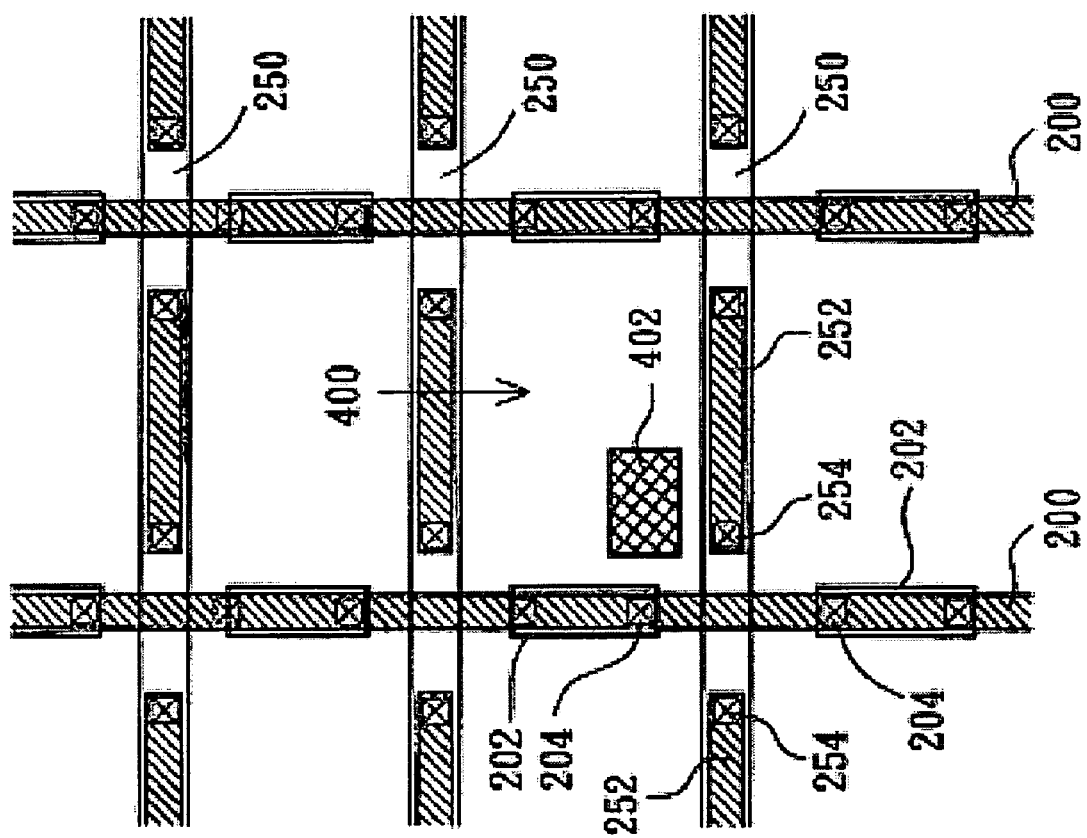
FIG. 9 illustrates a top view of a wire structure according to the present invention applied in a display.

FIG. 9 illustrates—a top view of a wire structure applied in a display in the present invention. Referring to FIG. 9, from the top view, a plurality of main lines 200 that is lower and is vertically parallelized and a plurality of main lines 250 that is higher and is horizontally parallelized are clearly illustrated. From the top view, the main lines 200 and the main lines 250 are crossed perpendicularly to form a reticulate structure, in which each grid of the reticulate structure represents a pixel unit 400, and each pixel unit 400 comprises a thin film transistor 402. Except for a cross-interconnected portion of the main lines 200 and the main lines 250, the rest of the reticulate structure is a double-layered wire structure.

For example, excluding the cross-interconnected portion, each of the main lines 200 comprises a plurality of branch lines 202 (located in the same layer as the main lines 250) which is above the main lines 200, and the main lines 200 are connected to the branch lines 202 by the plugs 204. Similarly, excluding the cross-interconnected portion, each of the main lines 250 comprises a plurality of branch lines 252 (located in the same layer as the main lines 200) which is above the main lines 250, and the main lines 250 are connected to the branch lines 252 by the plugs 254.

In FIG. 9, it is worthy of note that the width of the main lines 250 and the width of the branch lines 202 in the upper wire structure are depicted greater than that of the main lines 200 and that of the branch lines 252 in the lower wire structure merely for a better understanding of the objective of the wire structure of the present invention. In the preferred embodiment of the present invention, the aforementioned wires comprising the main lines 250, the branch lines 202, the main lines 200 and the branch lines 252 preferably have the same width, but the foregoing description is intended to illustrate and not limit the scope of the invention.

Although the preferred embodiment of the present invention only discloses a double-layered complementary wire structure and the manufacturing method thereof, the spirit and the concept of the present invention also can be applied in other multi-layered wire structures having more than two layers to obtain the objective of reduced resistance.

The present invention discloses a multi-layered complementary wire structure and the manufacturing method thereof. The structural conditions comprising, for example, the material of the insulated layer, and the material, shape and length of the wire can be changed according to the requirements of product devices. Aluminum, copper, chromium, and/or molybdenum are typically used as the material of the wire. Further, many kinds of thin film transistor structures are applied in pixel units, and the kind of the thin film transistor structure used in the present invention is not limited.

According to the aforementioned preferred embodiment of the present invention, with the application of the present invention, the resistance of the wire can be reduced. In addition, for the same effect of resistance, the application of the multi-layered complementary wire structure can decrease the cross-sectional area of the wire, thus increasing the opening ratio of the pixel unit. In the preferred embodiment of the present invention, by using a double-layered complementary wire-structure with a wire width of 12 um (micrometer), the present invention can obtain the same resistance as the conventional wire structure with a wire width of 20 um. For an opening area with a length of 60 um and a width of 14 um, the original opening area is:

$$60 \times 140 = 8400 (\mu m^2).$$

But, with the application of the present invention, the opening area is:

$$(60+8) \times (140+8) = 10064 (\mu m^2).$$

So, the increase of the opening ratio is:

$$(10064-8400)/8400 \times 100\% = 19.8\%.$$

Accordingly, the present invention is greatly advantageous for display manufacturing technology.

The multi-layered complementary wire structure of the present invention can be applied not only in the display field, but also in the other fields. When the multi-layered complementary wire structure of the present invention is applied in the other fields, the wire structure 100 illustrated in FIG. 6 and the wire structure 102 are not limited to use as a gate line or a data line. When the present invention is applied in the other fields, such as, for example, integrated circuit manufacturing technology, advantages of reducing resistance and decreasing critical dimension can be obtained. Therefore, the present invention is not limited to the display field.

Figure 10A:
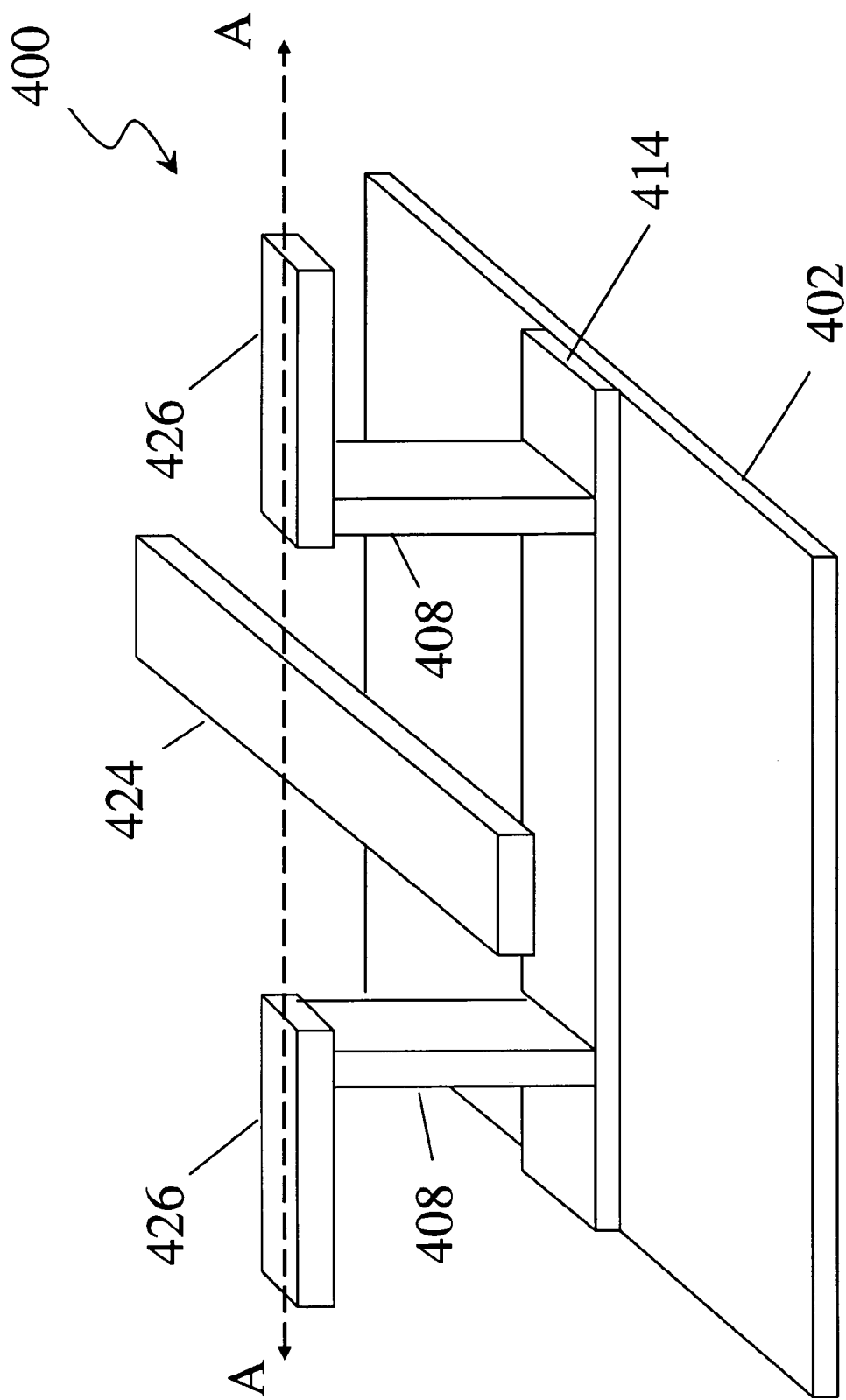
FIG. 10A is a schematic perspective view of a wire structure in accordance with one embodiment of the present invention.

FIG. 10A is a schematic perspective view of a wire structure 400 in accordance with one embodiment of the present invention. Wire structure 400 includes an array of first conductive lines and second conductive lines disposed orthogonal to first conductive lines. Referring to FIG. 10A, each of the first conductive line includes a main line 414, branch lines 426 and plugs 408. Main line 414 is substantially a straight, continuous line formed in a first layer on a substrate 402. Branch lines 426 are formed in a second layer over the first layer and are separated from each other. Each of branch lines 426 is connected to main line 414 through plugs 408. Each of the second conductive lines includes a main line 424, which is substantially a straight, continuous line formed in the second layer. Wire structure 400 is similar to wire structure 102 shown in FIG. 6 except that second conductive line 424 does not include any branch lines or plugs.

Figure 10B:
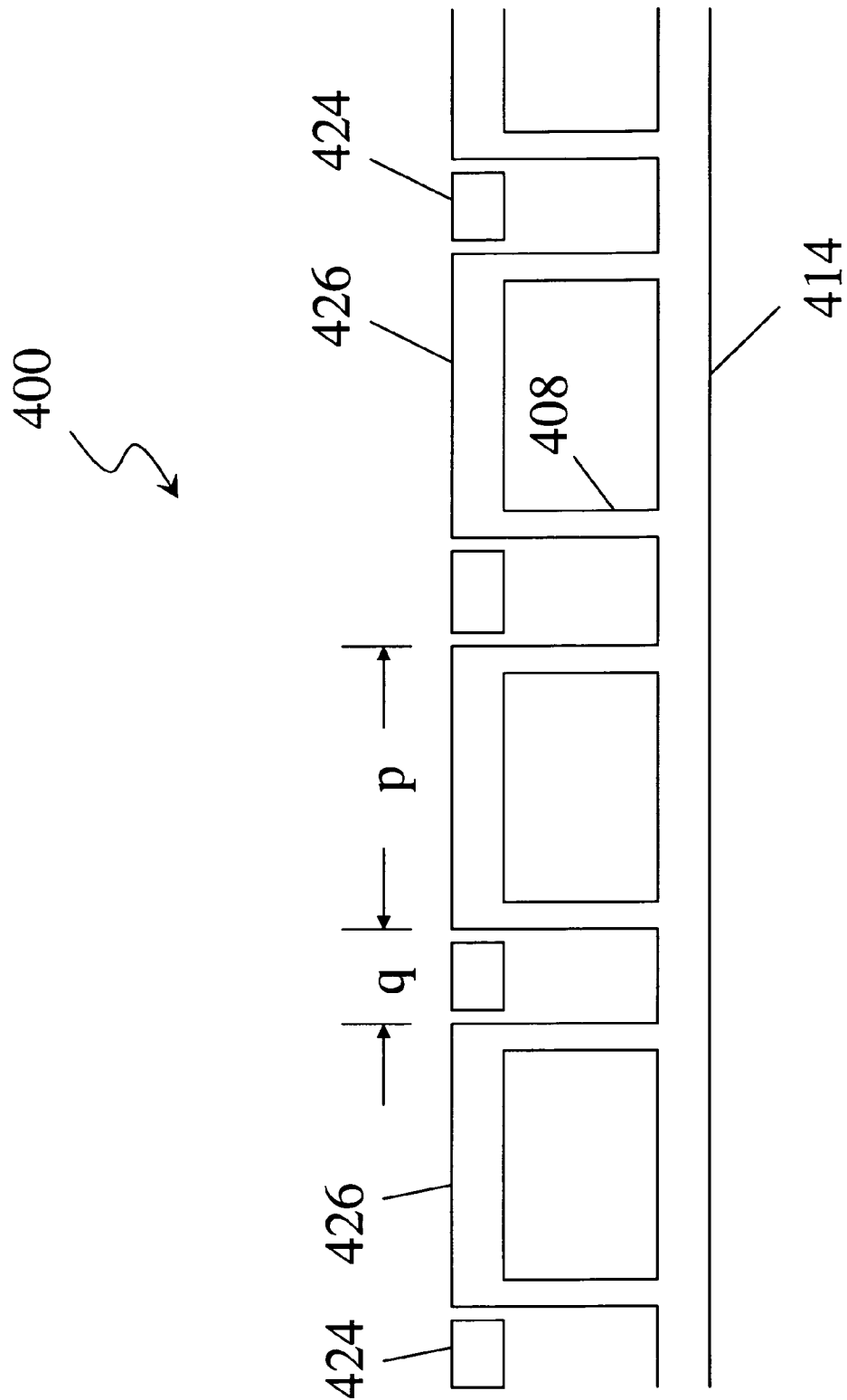
FIG. 10B is a schematic cross-sectional diagram of the wire structure shown in FIG. 10A taken along the AA direction.

FIG. 10B is a schematic cross-sectional diagram of wire structure 400 shown in FIG. 10A taken along the AA direction. Referring to FIG. 10B, each of second conductive lines 424 runs between branch lines 426. As previously discussed with respect to Table 2, the resistance of wire structure 400 decreases as the ratio p/q increases, where p represents the length of one of branch lines 426, and q represents the distance of a spacing that separates the one branch line 426 from an adjacent branch line.

A method for manufacturing multi-layered wire structure 400 in accordance with one embodiment of the present invention is discussed below. A substrate 402, which is made of glass or plastic, is defined. A first conductive layer is formed over substrate 402 by, for example, a deposition method. The first conductive layer is patterned by, for example, lithography and etching, to form a plurality of first conductive lines 414 in parallel to each other extending in a first direction. An insulating layer is formed, for example, by a deposition method, over the patterned first conductive layer. Each of first conductive lines 414 is insulated from each other by the insulating layer. The insulating layer is patterned to form openings, which expose portions of each of first conductive lines 414. The openings may take the form of a trench, cavity, hole or well. A second conductive layer is then formed over the patterned insulating layer to fill the openings. Next, the second conductive layer is patterned to form a plurality of second conductive lines 424 extending in a second direction orthogonal to the first direction, and a plurality of sets of third conductive lines 426 in parallel to each other extending in the first direction. Each set of third conductive lines 426 corresponds to one of first conductive lines 414.

Figure 11A:
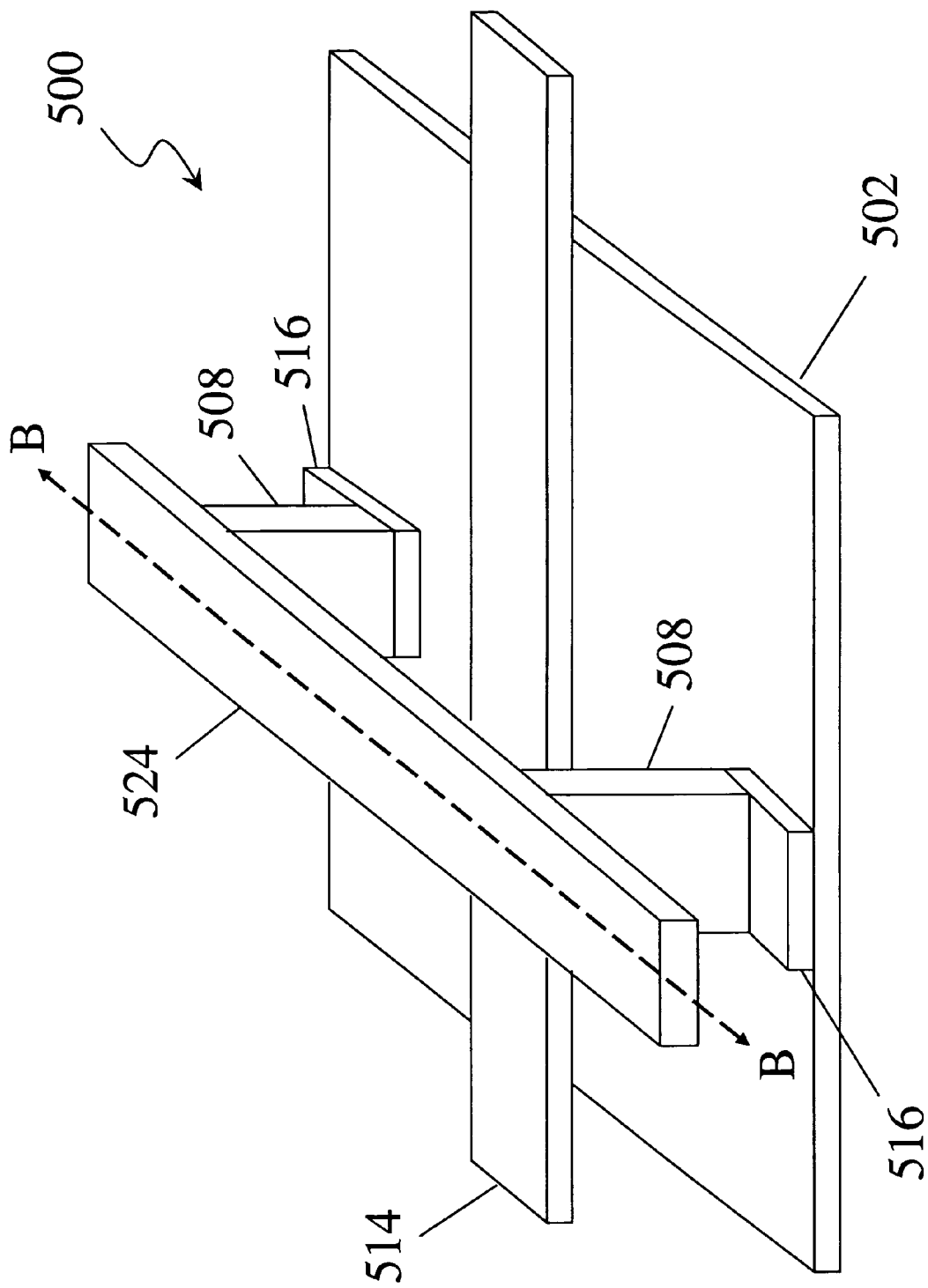
FIG. 11A is a schematic perspective view of a wire structure in accordance with another embodiment of the present invention.

FIG. 11A is a schematic perspective view of a wire structure 500 in accordance with another embodiment of the present invention. Wire structure 500 includes an array of first conductive lines and second conductive lines disposed orthogonal to first conductive lines. Referring to FIG. 11A, each of the first conductive line includes a main line 514, which is substantially a straight, continuous line formed in a first layer on a substrate 502. Each of the second conductive lines includes a main line 524, branch lines 516 and plugs 508. Main line 524 is substantially a straight, continuous line formed in a second layer over the first layer. Branch lines 516 are formed in the first layer and are separated from each other. Each of branch lines 516 is connected to main line 524 through plugs 508. Wire structure 500 is similar to wire structure 102 shown in FIG. 6 except that first conductive line 514 does not include any branch lines or plugs.

Figure 11B:
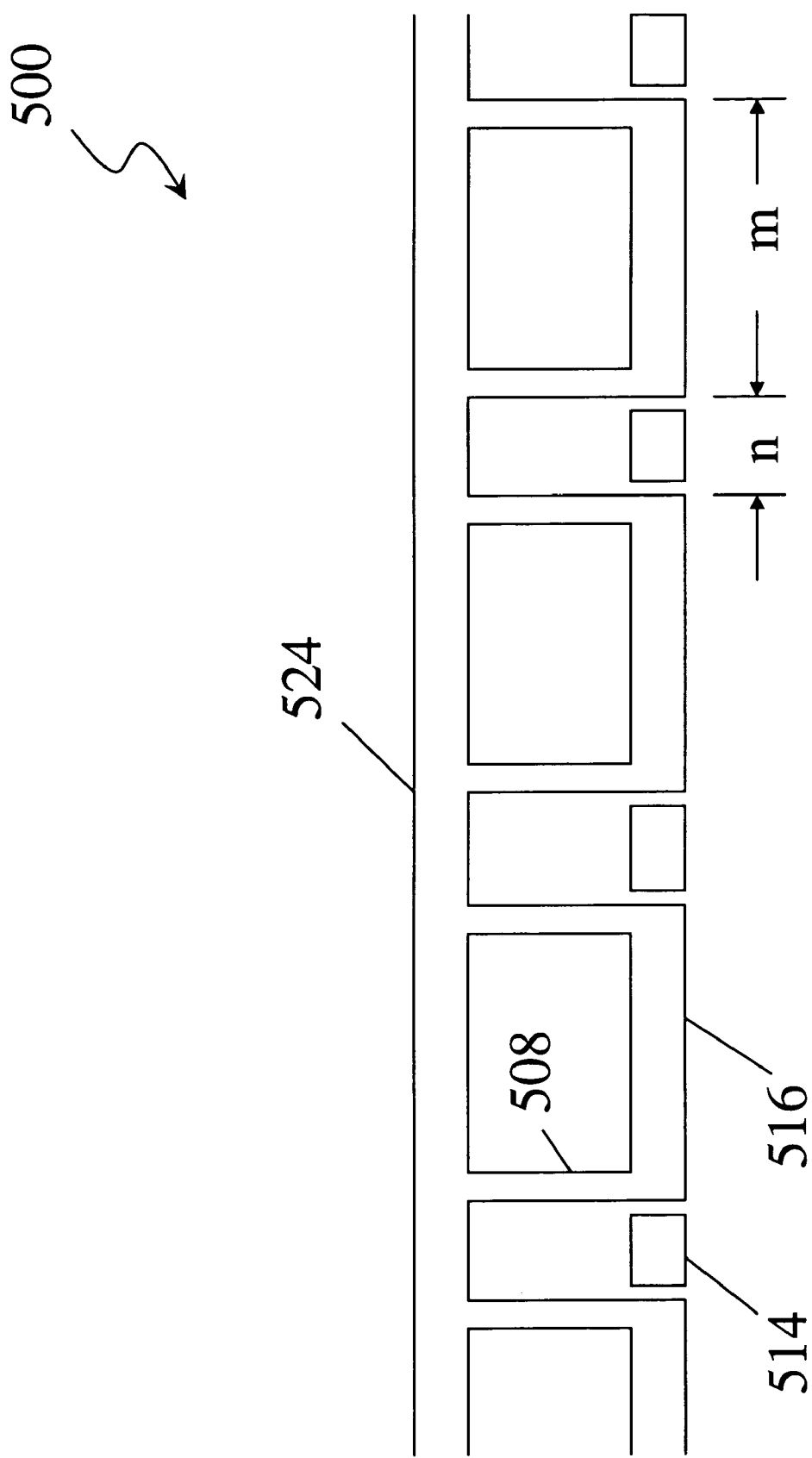
FIG. 11B is a schematic cross-sectional diagram of the wire structure shown in FIG. 11A taken along the BB direction.

FIG. 11B is a schematic cross-sectional diagram of wire structure shown 500 in FIG. 11A taken along the BB direction. Referring to FIG. 11B, each of first conductive lines 514 runs between branch lines 516. As previously discussed with respect to Table 2, the resistance of wire structure 500 decreases as the ratio m/n increases, where m represents the length of one of branch lines 516, and n represents the distance of a spacing that separates the one branch line 516 from an adjacent branch line.

A method for manufacturing multi-layered wire structure 500 in accordance with one embodiment of the present invention is discussed below. A substrate 502 is defined. A first conductive layer over substrate 502 is formed. The first conductive layer is patterned to form a plurality of first conductive lines 514 in parallel to each other extending in a first direction and a plurality of sets of second conductive lines 516 in parallel to each other extending in a second direction orthogonal to the first direction. Each set of second conductive lines 516 corresponds to one of first conductive lines 514. An insulating layer is formed on the patterned first conductive layer. The insulating layer is patterned to form openings, which expose a portion of each of second conductive lines 516. Next, a second conductive layer is formed over the patterned insulating layer to fill the openings. The second conductive layer is then patterned to form a plurality of third conductive lines 524 extending in the second direction. Each of third conductive lines 524 corresponds to one set of second conductive lines 516.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A multi-layered wire structure, comprising:
   a substrate;
   a plurality of first conductive lines formed in a first layer over the substrate extending in parallel to each other in a first direction;
   a plurality of second conductive lines formed in a second layer over the first layer extending in parallel to each other in a second direction orthogonal to the first direction;
   a plurality of sets of third conductive lines formed in the second layer extending in the first direction, each set of third conductive lines corresponding to one of the first conductive lines; and
   a plurality of sets of conductive paths formed between the first layer and the second layer, each set of conductive paths corresponding to one of the first conductive lines and one set of third conductive lines and electrically connecting the corresponding first conductive line to the corresponding set of third conductive lines.

2. The wire structure of claim 1, wherein the third conductive lines in each set are separated from each other at a predetermined spacing.

3. The wire structure of claim 2, wherein a ratio of a length of each of the third conductive lines to the predetermined spacing ranges from about 2 to about 9.

4. The wire structure of claim 1, wherein each of the first, second or third conductive lines is made of at least material selected from the group consisting of copper, aluminum, chromium and molybdenum.

5. The wire structure of claim 1, wherein each of the conductive paths is made of at least material selected from the group consisting of copper, aluminum, chromium and molybdenum.

6. A multi-layered wire structure, comprising:
   a substrate;
   a plurality of first conductive lines formed in a first layer over the substrate extending in parallel to each other in a first direction;
   a plurality of second conductive lines formed in a second layer over the first layer extending in parallel to each other in a second direction orthogonal to the first direction;
   a plurality of sets of third conductive lines formed in the first layer extending in the second direction, each set of third conductive lines corresponding to one of the second conductive lines; and
   a plurality of sets of conductive paths formed between the first layer and the second layer, each set of conductive paths corresponding to one of the second conductive lines and one set of third conductive lines and electrically connecting the corresponding second conductive line to the corresponding set of third conductive lines.

7. The wire structure of claim 6, wherein the third conductive lines in each set are separated from each other at a predetermined spacing.

8. The wire structure of claim 7, wherein a ratio of a length of each of the third conductive lines to the predetermined spacing ranges from about 2 to about 9.

9. The wire structure of claim 6, wherein each of the first, second or third conductive lines is made of at least one material selected from the group consisting of copper, aluminum, chromium and molybdenum.

10. The wire structure of claim 6, wherein each of the conductive paths is made of at least one material selected from the group consisting of copper, aluminum, chromium and molybdenum.

11. A display device, comprising:
    a substrate;
    a plurality of gate lines formed in a first layer over the substrate extending in parallel to each other in a first direction;
    a plurality of data lines formed in a second layer over the first layer extending in parallel to each other in a second direction orthogonal to the first direction;
    an array of pixel units formed over the substrate, each of the pixel units being disposed near an intersection of one of the gate lines and one of the data lines;
    a plurality of sets of conductive lines formed in the second layer extending in the first direction, each set of conductive lines corresponding to one of the gate lines; and a plurality of sets of conductive paths formed between the first layer and the second layer, each set of conductive paths corresponding to one of the gate lines and one set of conductive lines and electrically connecting the corresponding gate line to the corresponding set of conductive lines.

12. The device of claim 11, wherein the conductive lines in each set are separated from each other at a predetermined spacing.

13. The device of claim 12, wherein a ratio of a length of each of the conductive lines to the predetermined spacing ranges from about 2 to about 9.

14. A display device, comprising:
a substrate;
a plurality of gate lines formed in a first layer over the substrate extending in parallel to each other in a first direction;
a plurality of data lines formed in a second layer over the first layer extending in parallel to each other in a second direction orthogonal to the first direction;
a plurality of pixel units formed over the substrate, each of the pixel units being disposed near an intersection of one of the gate lines and one of the data lines;
a plurality of sets of conductive lines formed in the first layer extending in the second direction, each set of conductive lines corresponding to one of the data lines; and
a plurality of sets of conductive paths formed between the first layer and the second layer, each set of conductive paths corresponding to one of the data lines and one set of conductive lines and electrically connecting the corresponding data line to the corresponding set of conductive lines.

15. The device of claim 14, wherein the conductive lines in each set are separated from each other at a predetermined spacing.

16. The device of claim 15, wherein a ratio of a length of each of the conductive lines to the predetermined spacing ranges from about 2 to about 9.

17. A method for manufacturing a multi-layered wire structure, comprising:
defining a substrate;
forming a first conductive layer over the substrate;
patterning the first conductive layer to form a plurality of first conductive lines in parallel to each other extending in a first direction and a plurality of sets of second conductive lines in parallel to each other extending in a second direction orthogonal to the first direction, each set of second conductive lines corresponding to one of the first conductive lines;
forming an insulating layer on the first conductive layer;
patterning the insulating layer to form openings into the insulating layer to expose a portion of each of the second conductive lines;
forming a second conductive layer on the insulating layer to fill the openings; and
patterning the second conductive layer to form a plurality of third conductive lines extending in the second direction, each of the third conductive lines corresponding to one set of second conductive lines.

18. The method of claim 17, wherein the second conductive lines in each set are separated from each other at a predetermined spacing.

19. A method for manufacturing a multi-layered wire structure, comprising:
defining a substrate;
forming a first conductive layer over the substrate;
patterning the first conductive layer to form a plurality of first conductive lines in parallel to each other extending in a first direction;
forming an insulating layer on the first conductive layer;
patterning the insulating layer to form openings into the insulating layer to expose portions of each of the first conductive lines;
forming a second conductive layer on the insulating layer to fill the openings; and
patterning the second conductive layer to form a plurality of second conductive lines extending in a second direction orthogonal to the first direction and a plurality of sets of third conductive lines in parallel to each other extending in the first direction, each set of the third conductive lines corresponding to one of the first conductive lines.

20. The method of claim 19, wherein the third conductive lines in each set are separated from each other at a predetermined spacing.

* * * * *